(12) United States Patent
Shimizu et al.

(10) Patent No.: US 8,314,647 B2
(45) Date of Patent: Nov. 20, 2012

(54) DYNAMIC LEAKAGE CONTROL USING SELECTIVE BACK-BIASING

(75) Inventors: Daniel Shimizu, Sunnyvale, CA (US); Chi-Shung David Wang, Sunnyvale, CA (US); Qi Chen, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/159,052

(22) Filed: Jun. 13, 2011

(65) Prior Publication Data

US 2011/0279938 A1    Nov. 17, 2011

Related U.S. Application Data

(63) Continuation of application No. 11/707,602, filed on Feb. 15, 2007, now abandoned.

(51) Int. Cl.
*H03K 3/01* (2006.01)
(52) U.S. Cl. .................................................. 327/534
(58) Field of Classification Search .............. 327/530, 327/534, 535, 537, 538, 543
See application file for complete search history.

(56) References Cited

U.S. PATENT DOCUMENTS

| | | | |
|---|---|---|---|
| 5,745,375 A | 4/1998 | Reinhardt et al. | |
| 6,177,831 B1 | 1/2001 | Yoneda | |
| 6,411,156 B1 | 6/2002 | Borkar et al. | |
| 6,433,584 B1 | 8/2002 | Hatae | |
| 6,867,637 B2 | 3/2005 | Miyazaki et al. | |
| 6,927,619 B1 | 8/2005 | Doyle | |
| 6,943,613 B2 | 9/2005 | Miyazaki et al. | |
| 7,161,408 B2 | 1/2007 | Mizuno et al. | |
| 7,295,036 B1 | 11/2007 | Zaveri | |
| 7,417,489 B2 | 8/2008 | Fujita et al. | |
| 2006/0176099 A1 | 8/2006 | Tsunetou | |
| 2007/0008011 A1 | 1/2007 | Thurston | |

FOREIGN PATENT DOCUMENTS

JP    10187270 A    7/1998

*Primary Examiner* — Jeffrey Zweizig
(74) *Attorney, Agent, or Firm* — Volpe and Koenig, P.C.

(57) ABSTRACT

Embodiments of a dynamic leakage control circuit for use with graphics processor circuitry are described. The dynamic leakage control circuit selectively enables back biasing of the transistors comprising the graphics processor circuits during particular modes of operation. The back biasing levels are controlled by two separate power rails. A first power rail is coupled to an existing power supply and the second power rail is coupled to a separate adjustable voltage regulator. A separate voltage regulator may also be provided for the first power rail. A hardware-based state machine or software process is programmed to detect the occurrence of one or more modes of operation and adjust the voltage regulators for the first and second power rails to either enable or disable the back biasing state of the circuit, or alter the threshold voltage of the circuit within a specified voltage range.

12 Claims, 8 Drawing Sheets

DYNAMIC LEAKAGE CONTROL USING SELECTIVE BACK-BIASING

CROSS REFERENCE TO RELATED APPLICATION

This application is a continuation of U.S. patent application Ser. No. 11/707,602, filed Feb. 15, 2007, now abandoned, which is incorporated by reference as if fully set forth.

FIELD OF INVENTION

Embodiments of the invention relate generally to electronic circuits, and more specifically to reducing leakage power in transistor circuits.

BACKGROUND

Microprocessor circuits typically operate in two primary operating states, active mode and standby mode. In active mode, the circuits are executing processes or tasks, and are usually running at the specified operating frequency of the circuit. During active mode, most of the transistor gates are switching and relatively high operating frequencies are required. During standby or sleep mode, processing tasks are usually idle and relatively few gates are switching, thus requiring lower operating frequencies. The power consumed in transistor circuits is a function of both switching power and leakage power. Even when a circuit is in standby mode, potentially significant amounts of power can be consumed due to power leakage in the transistors. Therefore, while the power of a circuit operating in active mode is a combination of dynamic (switching) power and leakage power, with dynamic power being the dominant factor, in standby mode where few gates are switching, power consumption is largely a function of leakage power.

As device designs scale down to finer geometries (e.g., from 90 nm to 65 nm or smaller), circuits can run at lower voltages for given operating frequencies, thus reducing dynamic power consumption. However, leakage power increases exponentially as device geometries decrease. This is due to the fact that operating characteristics of the transistors change as the dimensions change, especially with regard to the effect of the threshold voltage $V_{TH}$, which is the voltage at which a transistor switches state. In general, the decreasing dimensions of the transistors causes a scaling of the threshold voltage $V_{TH}$ relative to the supply voltage, which leads to an increase in leakage power. Because leakage power is the dominant factor in power consumption during standby mode, as circuit dimensions scale downward, the effect of leakage power becomes much more significant for this mode of operation. This effect can be an important issue with mobile or battery-operated devices that have limited power supply capacity, and which may spend significant amounts of time in standby or sleep mode, such as mobile phones, Personal Digital Assistants (PDAs), notebook computers, and similar devices.

A simple method of reducing power consumption due to leakage power that is presently used is to reduce the operating voltage of the circuit itself, but this obviously reduces the performance of the circuit and reverses the trend toward ever-increasing processor and circuit operating speeds. Another known method of reducing standby power consumption is to shift the threshold voltage levels of the transistors. In general, increasing the threshold voltage will decrease the leakage power, and thus reduce standby power consumption. However, increasing the threshold voltage also decreases the switching speed of the transistor, thus decreasing circuit performance when the circuit operates in active mode. Present methods of reducing leakage power are thus generally disadvantageous and do not adequately account for the operating mode of the circuits in order to dynamically and flexibly alter the threshold voltage of the transistors in accordance with the operating mode and other relevant parameters of the circuit.

BRIEF DESCRIPTION OF THE DRAWINGS

Embodiments of the present invention are illustrated by way of example and not limitation in the figures of the accompanying drawings, in which like references indicate similar elements and in which.

DETAILED DESCRIPTION OF THE PREFERRED EMBODIMENTS

Embodiments of a dynamic leakage control circuit for use with graphics processor circuitry are described. The dynamic leakage control circuit selectively enables back biasing of the transistors comprising the graphics processor circuits during particular modes of operation. The back biasing levels are controlled by two separate power rails. A first power rail is coupled to an existing power supply and the second power rail is coupled to a separate adjustable voltage regulator. A separate voltage regulator may also be provided for the first power rail. A hardware-based state machine or software process is programmed to detect the occurrence of one or more modes of operation and adjust the voltage regulators for the first and second power rails to either enable or disable the back biasing state of the circuit, or alter the threshold voltage of the circuit within a specified voltage range.

In the following description, numerous specific details are introduced to provide a thorough understanding of, and enabling description for, embodiments of the dynamic leakage control circuit. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments.

In one embodiment, a back biasing scheme is used to increase the threshold voltage of one or more transistors in a circuit to cut off or reduce the leakage current through the transistor or transistors. In one embodiment, one or more power supply rails are provided through voltage regulators to enable or disable back-biasing of the transistors, or to provide some degree of back-biasing by shifting the effective threshold voltage of the transistor circuit along a specified voltage range.

Figure 1A:
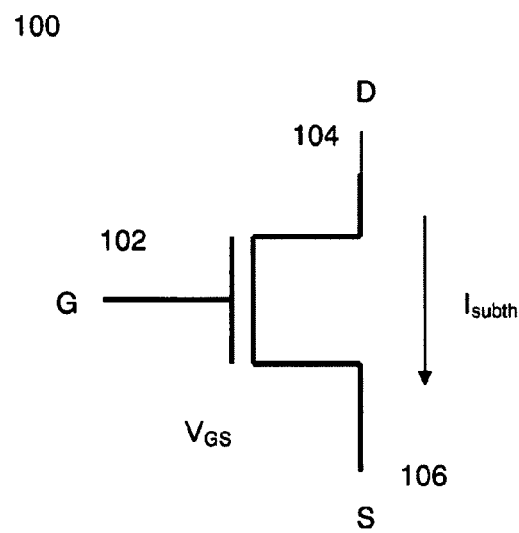
FIG. 1A illustrates a MOS (metal-oxide semiconductor) transistor, which implements a back bias method for reducing leakage current, under an embodiment.

FIG. 1A illustrates a MOS (metal-oxide semiconductor) transistor, which implements a back bias method for reducing leakage current, under an embodiment. Transistor 100 represents a generalized MOS transistor, which comprises a gate (G) 102, a source (S) 104 and a drain (D) 106. Transistor 100 could be any type of MOS transistor (i.e., N-type, P-type) operating in any mode (i.e., enhancement mode, depletion mode), or any equivalent or similar type of transistor device. The gate-source voltage for transistor 100 is denoted $V_{GS}$, and changing this voltage modulates the current that flows between the source 106 and drain 104. One of the dominant leakage mechanisms in a transistor, such as transistor 100 is the subthreshold (or channel) leakage, denoted $I_{subth}$. Subthreshold leakage power is the power generated by the current flow, $I_{subth}$, between the source 106 and drain 104 when the gate voltage is below the threshold voltage.

Figure 1B:
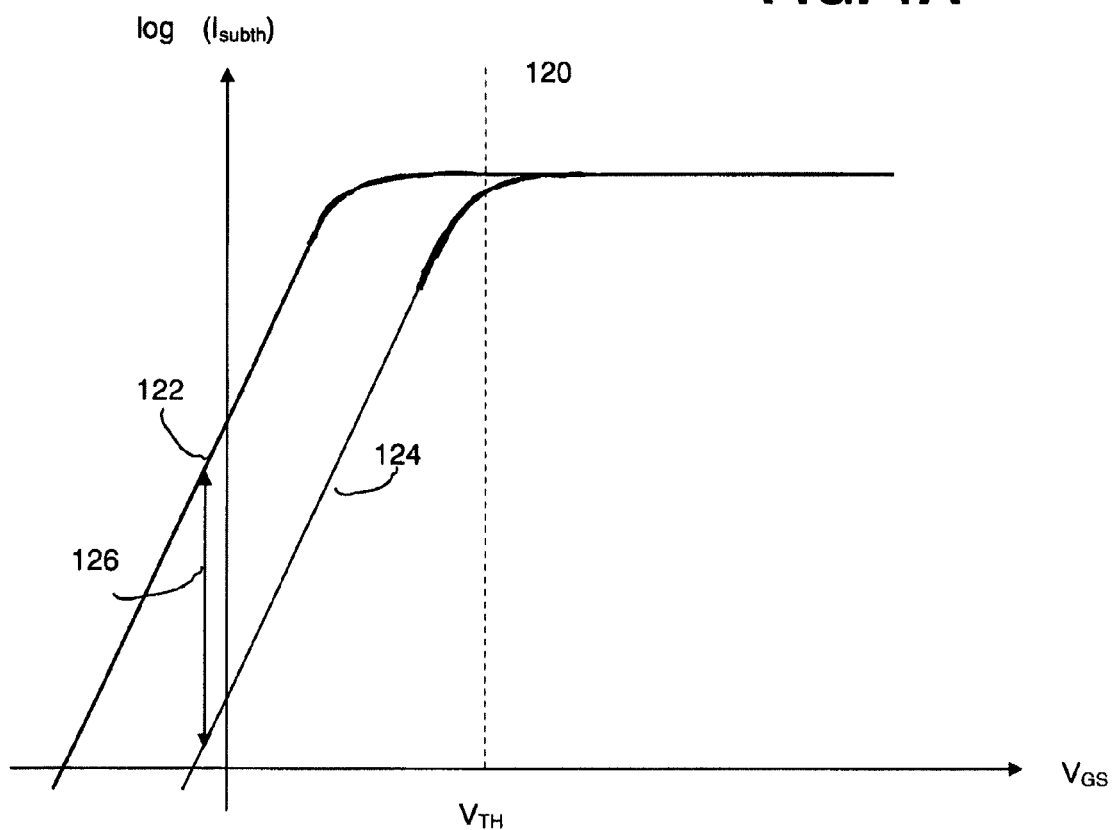
FIG. 1B illustrates the use of back bias techniques to reduce leakage current in the transistor of FIG. 1A, under an embodiment.

Several techniques have been developed to reduce the leakage current in transistors, though most involve tradeoffs with regard to performance, cost, complexity, and so on. One such technique is back biasing the transistors within a circuit to reduce the effective threshold voltage of the transistor. Back biasing (also referred to as "body biasing") refers to a technique in which the body terminal of a transistor is connected to a small negative voltage to effectively increase the body-source voltage. A difference between the source and body changes the threshold voltage, and is known as the body effect of the transistor. FIG. 1B illustrates the use of back bias techniques to reduce leakage current, under an embodiment. FIG. 1B illustrates a plot of drain-source current versus the gate-source voltage for a transistor, such as transistor 100 of FIG. 1A. As shown by I-V (transfer) curve 122, the threshold voltage, $V_{TH}$, represents the voltage at which the transistor turns on, or changes state. Line 120 represents the subthreshold slope, which determines how effective the transistor can be turned off when $V_{GS}$ is decreased below $V_{TH}$. I-V curve 122 represents the transfer curve of the circuit when back biasing is disabled, and I-V curve 124 represents the transfer curve of the circuit when back-biasing is enabled. The difference 126 of the two curves 122 and 124 along the $I_{subth}$ axis represents the reduction in leakage current for the circuit when back biasing is enabled. Thus, introducing back bias increases the threshold voltage (shifts the I-V curve to the right) and cuts off or decreases the leakage current, $I_{subth}$.

In one embodiment, a transistor-based circuit includes two separate power supply rails, denoted BBP (back bias positive) and BBN (back bias negative), to provide voltage levels to alter the threshold voltage. The positive back bias voltage supply rail BBP provides a positive voltage denoted $V_{BP}$, and the negative back bias voltage supply rail BBN provides a negative voltage denoted $V_{BN}$. These voltage levels are applied to the appropriate body terminals of the transistors to enable back biasing of the circuit.

Figure 2A:
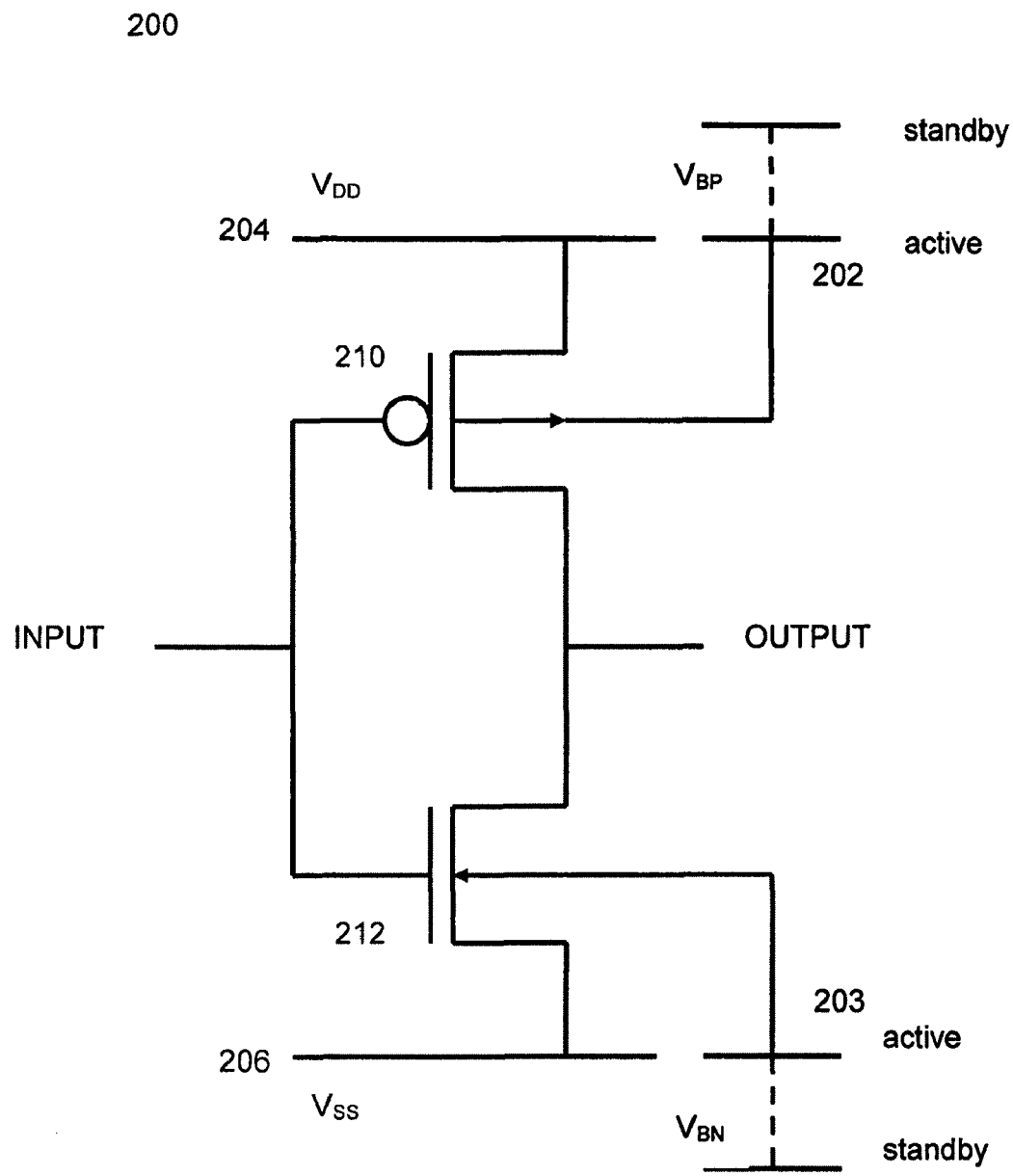
FIG. 2A illustrates a schematic for a transistor circuit including body bias voltage supplies to dynamically change the threshold voltage of the circuit, under an embodiment.

FIG. 2A illustrates a schematic for a transistor circuit including back bias voltage supplies to dynamically change the threshold voltage of the circuit, under an embodiment. Circuit 200 illustrates a CMOS inverter circuit comprising a P-Channel CMOS transistor 210 coupled to an N-Channel CMOS transistor 212. A drain voltage $V_{DD}$ is applied to a power rail 204 coupled to the drain of transistor 210 and a source voltage $V_{SS}$ is applied to a power rail 206 coupled to the source of transistor 212. The body terminal of transistor 210 is coupled to the positive back bias voltage $V_{BP}$, which is applied through BBP power rail 202. As shown in circuit 200, the $V_{BP}$ level ranges between a standby level and an active level. The body terminal of transistor 212 is coupled to the negative back bias voltage $V_{BN}$, which is applied through BBN power rail 203. The value of $V_{BN}$ also ranges between an active level and a standby level.

Figure 2B:
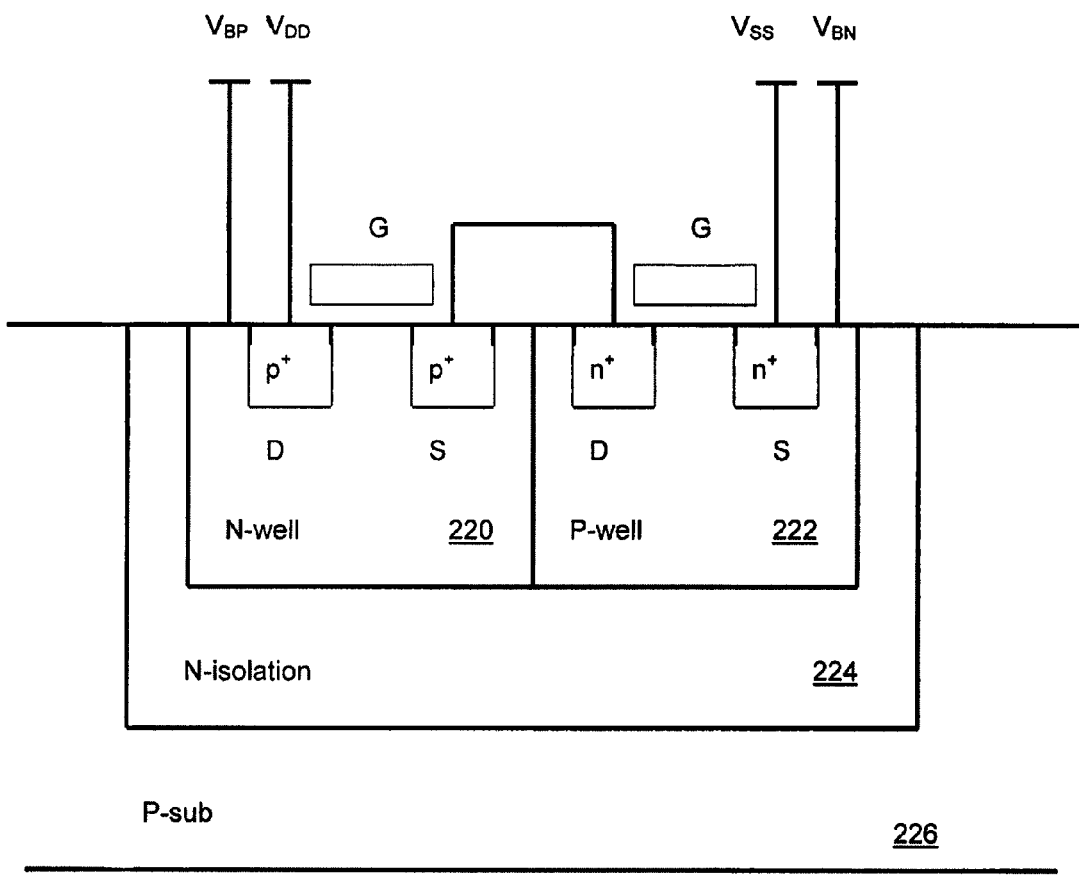
FIG. 2B illustrates a side-view of a fabricated transistor circuit for the schematic of FIG. 2A.

FIG. 2B illustrates a side-view of a fabricated transistor circuit for the schematic of FIG. 2A. The transistor circuit 250 comprises a P-substrate 226 into which is formed an N-isolation region 224. The P-type transistor 210 of FIG. 2A is formed by the N-well region 220, which includes the P-doped drain D and source S regions and gate 221. The N-type transistor 212 of FIG. 2A is formed by the P-well region 222, which includes N doped drain D and source regions, and gate 223. The positive back bias voltage supply $V_{Bp}$ is coupled to the N-well body region 220 of transistor 210, and the negative back bias voltage supply $V_{BN}$ is coupled to the P-well body region 222 of transistor 212.

As shown in FIGS. 2A and 2B, the back bias voltage levels $V_{BP}$ and $V_{BN}$, are applied to the inverter circuit 200 to back bias the transistors 210 and 212, thereby raising the threshold voltage $V_{TH}$, as shown in FIG. 1B, and reducing the leakage current through the transistors. As shown in FIG. 2B, the inclusion of a back bias mechanism requires the addition of a separate bias voltage mesh, and a slight increase in transistor area and the addition of a deep N-well region 224 for isolation. However, the benefit provide by the reduction in leakage power without requiring significant decreases in operating frequency may outweigh the increased size and fabrication requirements for new generation devices that feature greatly reduced gate sizes.

As shown in FIGS. 2A and 2B, the voltages needed to back bias the transistors are provided by two separate power rails. In one embodiment, one or more adjustable voltage regulators are coupled to the power supply rails to regulate the voltages provided by the back bias voltage supply rails. This allows the threshold voltage to be altered along a voltage scale defined by the voltage range of the voltage regulator or regulators. In one embodiment, the voltage regulator circuitry is controlled by a programmable circuit or software process that controls the back bias voltage rails based on a number of parameters related to the relevant operating characteristics of the transistor circuit. The actual values for the positive and negative back bias voltage levels depend upon various factors related to actual circuit implementation and requirements, such as supply voltage level, operating frequency, circuit configuration, transistor types, and so on. In one example embodiment, the $V_{BP}$ levels can range from a minimum of 1.0V to a maximum of 2.0V, while the $V_{BN}$, levels can range from a minimum of −1.0V to a maximum of 0V. Depending on transistor type and other factors, many other ranges are possible, such as 1.5V to 1.8V for $V_{BP}$, and −0.5V to 0V for $V_{BN}$.

In one embodiment, the transistor circuit, such as inverter 200 of FIG. 2A, is part of an Application Specific Integrated Circuit (ASIC) that is used in or as part of a Graphics Processing Unit (GPU), or Visual Processing Unit (VPU), which is a dedicated graphics rendering device for a personal computer, workstation, or game console. A GPU typically implements a number of graphics primitive operations for generating 2D and 3D computer graphics, as well as executing other digital video-related processes. For this embodiment, the parameters that dictate the control of the voltage regulator circuit for control of the back bias voltage levels are based on the power requirements related to generation of graphics images and execution of graphics processes. In active mode, a graphics processor is typically performing many memory-intensive and arithmetic/logic intensive tasks as it generates graphics elements and depicts motion, and executes 3D processes, etc. In this case, most of the gates of the GPU are actively switching and the maximum frequency of the GPU is utilized. During standby mode, the display screen may be static and relatively few gates are switching, and complex processes, such as 3D rendering are idle.

For this embodiment, the parameters that dictate the control of the voltage regulators include the performance level desired, operating frequency, supply voltage, types of circuits enabled, operating mode, and other similar factors. The performance level that is desired can range from high performance, which requires maximum clock frequency operation without regard for power consumption; medium performance, which requires a balance between performance and power consumption; and low performance, which requires minimum power consumption in exchange for performance, such as when the circuit is operating from battery power. The type of circuits that are back bias enabled can include any of the components of modules in the processor or ASIC. For example, for a GPU, the circuits enabled can include 2D or 3D graphics pipes, on-board caches, and the like. This is also related to the operating mode, which could include 2D or 3D mode, high resolution/low resolution, grayscale/color, and so on.

Figure 3:
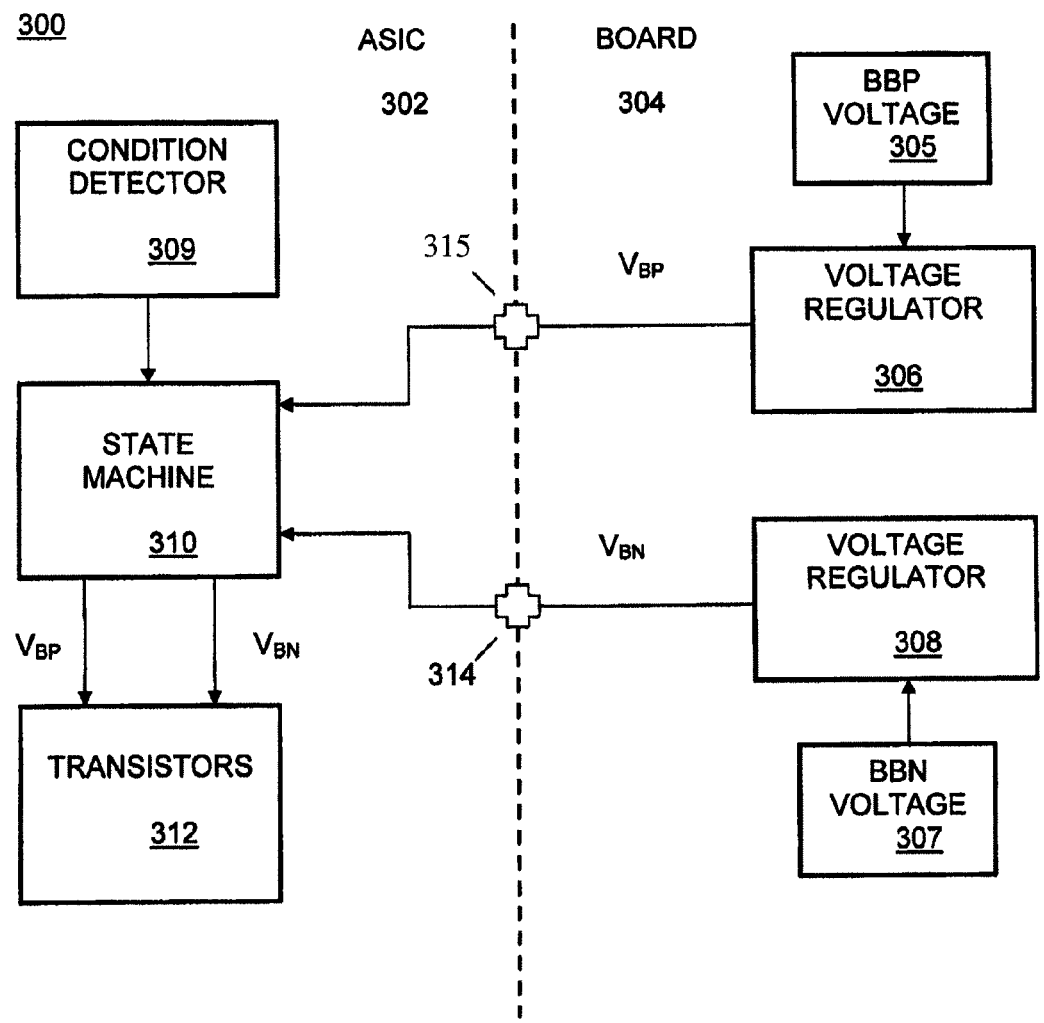
FIG. 3 is a circuit diagram that illustrates a voltage control circuit for altering the threshold voltage of a transistor circuit based on the status circuit conditions, under an embodiment.

In one embodiment, an on-chip state machine is configured to control the application of the back bias voltage levels to the transistor circuits based on one or more parameters and/or operating conditions of the circuit. FIG. 3 is a circuit diagram that illustrates a voltage control circuit for altering the threshold voltage of a transistor circuit based on the status circuit conditions, under an embodiment. As shown in system 300, the transistor circuit 312 to be controlled is included on an ASIC 302. The back bias voltage supplies are provided off-chip and on the board 304. For the embodiment of FIG. 3, the positive back bias voltage supply 305 is controlled by voltage regulator 306 to provide $V_{BP}$, and the negative back bias voltage supply 307 is controlled by voltage regulator 308 to provide $V_{BN}$. The $V_{BP}$ and $V_{BN}$ voltages are input to the ASIC through general purpose input/output (GPIO) ports 315 and 314. As shown in system 300, the ASIC includes an on-chip state machine that receives the $V_{BP}$ and $V_{BN}$ voltages from the GPIO ports. The state machine 310 is configured to pass the $V_{BP}$ and $V_{BN}$ voltages to the transistors 312 in order to enable back biasing of the transistors to thereby reduce the leakage power of the transistors. Because of certain inherent disadvantages to permanent back biasing of transistors, it is generally not desirable to permanently apply back bias voltages to the transistors 312. The state machine 310 is configured to enable back biasing under conditions in which the benefits of reducing leakage current outweigh the disadvantages of back biasing the transistors. A common example of such a condition is when the ASIC 302 is in standby mode. For the embodiment shown in FIG. 3, a condition detector component 309 monitors the state of the conditions and provides this information to state machine 310. In the event of a detected condition, the state machine 310 will pass the back bias voltages to the transistors 312 to enable back biasing.

Although condition detector 309 is shown as a separate functional component, it could be incorporated as an integral part of state machine 310. Similarly, although the voltage regulators 306 and 308 are shown in system 300 to be off-chip and on board 304, they could also be provided on ASIC 302 directly, depending upon circuit constraints and implementation details. Likewise, state machine circuit 310 could be provided on board 304 instead of directly on the ASIC 302.

In one embodiment, the state machine 310 is embodied in a software process that controls the change of power state based on the parameters. The software process directly controls the voltage regulator or regulators that change the $V_{BP}$ and $V_{BN}$ voltage levels. In an alternative embodiment, hardware circuitry is employed in place of a software process to change the power profile based on circuit or ASIC activity. For this embodiment, the state machine 310 is embodied in one or more hardwired circuits or dedicated on-chip logic devices.

For the system of FIG. 300, various conditions or indicators of activity are monitored by condition detector 309 to trigger a change in the back bias voltage levels through state machine 310. A condition for enabling back biasing of transistors 312 could be the entry of ASIC 302 into a standby mode, although other conditions are also possible. For entry into standby mode, various indicators of activity (or inactivity) could be used to trigger the enablement of the back bias voltages. These indicators include the display of a static screen display, lack of circuit busy signals, reduced FIFO buffer levels, generation of a sleep signal, reduced power supply draw, and any other appropriate indicators of switch from active mode to standby mode. In this case, the condition detector 309 would detect such a condition and send an appropriate signal to the state machine 310, which would then pass the back bias voltages to the transistors 312 to enable back biasing. The use of conditions to trigger the back biasing of the transistors introduces an element of dynamic processing to the reduction of leakage current, and allows leakage control based on actual operating conditions or pre-programmed parameters.

Figure 4:
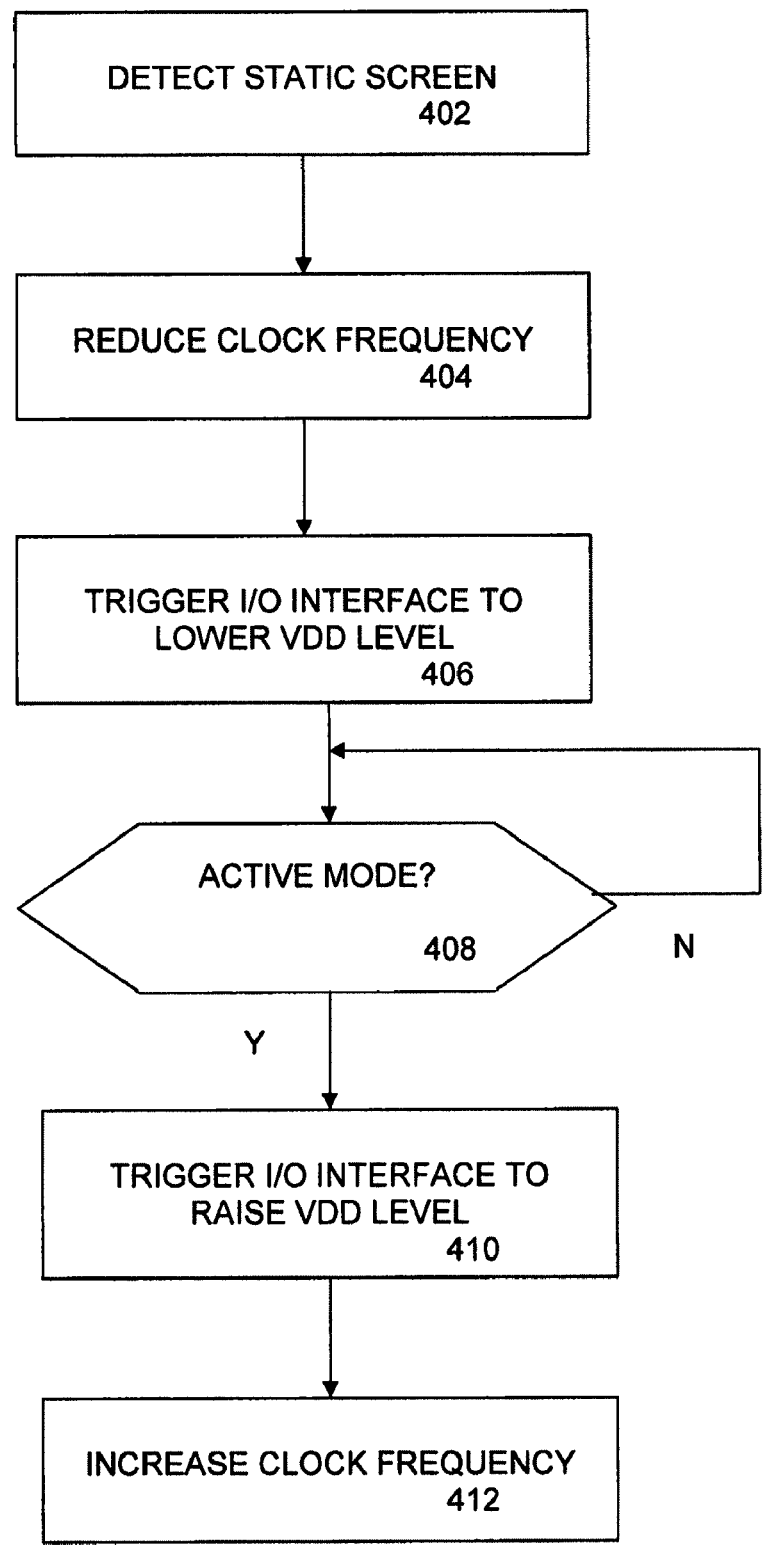
FIG. 4 is a flowchart that illustrates a method of dynamically reducing leakage current based on the status of a screen display, under an embodiment.

As stated above, various indicators could be used to detect the presence of the ASIC entering standby mode. In one embodiment, a primary indicator is the presence of a static screen display. Such a condition often indicates lack of activity on the part of the user, and many devices are configured to enter sleep mode after a certain period of time (time-out period) in order to conserve energy. A simple method of dynamically reducing leakage power in the event of a circuit entering standby mode is to reduce the supply voltage (drain voltage) during the period in which the circuit is idle. FIG. 4 is a flowchart that illustrates a method of dynamically reducing leakage current based on the status of a screen display, under an embodiment. In block 402, the process detects whether a static screen condition is detected. Various indicators can be used to detect this condition, such as if the same screen display elements as a whole or for a significant portion of the entire screen display are static for a specified number of frames. Upon detection of a static screen condition, the process reduces the current clock operating frequency by a predetermined factor, such as by one-half or one-quarter of the frequency, block 404. The clock frequency can be reduced by any appropriate process, such as a glitch-free post PLL (phase-locked loop) divide process, or the like. In block 406, the process triggers the GPIO interface (or other I/O interface) to reduce the $V_{DD}$ voltage (supply voltage) level. The reduction of the drain voltage effectively reduces leakage current through the transistors, thus reducing the leakage power of the ASIC during standby mode. The amount of voltage reduction should be selected so that sufficient power overhead is available to ensure the transistors can still function in standby mode.

In one embodiment, the transistors are kept in the reduced supply voltage condition until a change in from standby mode to active mode of the ASIC is detected. Thus, as shown in block 408, the process determines whether the chip has entered active mode. If so, the transistors are taken back to their original supply voltage levels so that they can operate at their maximum possible clock speeds. As shown in block 410, the GPIO interface is triggered to raise the VDD voltage level so as to restore the operating voltage to its normal level. The clock frequency is then increased to its normal or maximum operating frequency, block 412, to enable the ASIC to function optimally in active mode.

As shown in block 402 of FIG. 4, the process first detects a static screen. In one embodiment, the circuit is configured to detect a busy or idle signal that may also be used by the display processor for clock gating. A hysteresis delay is used for entering and exiting the static screen mode to reduce the chance that the circuit will drop in and out during performance critical times, and eliminates the ramp up time required for the voltage regulator to switch back to full performance mode during these periods.

Figure 5:
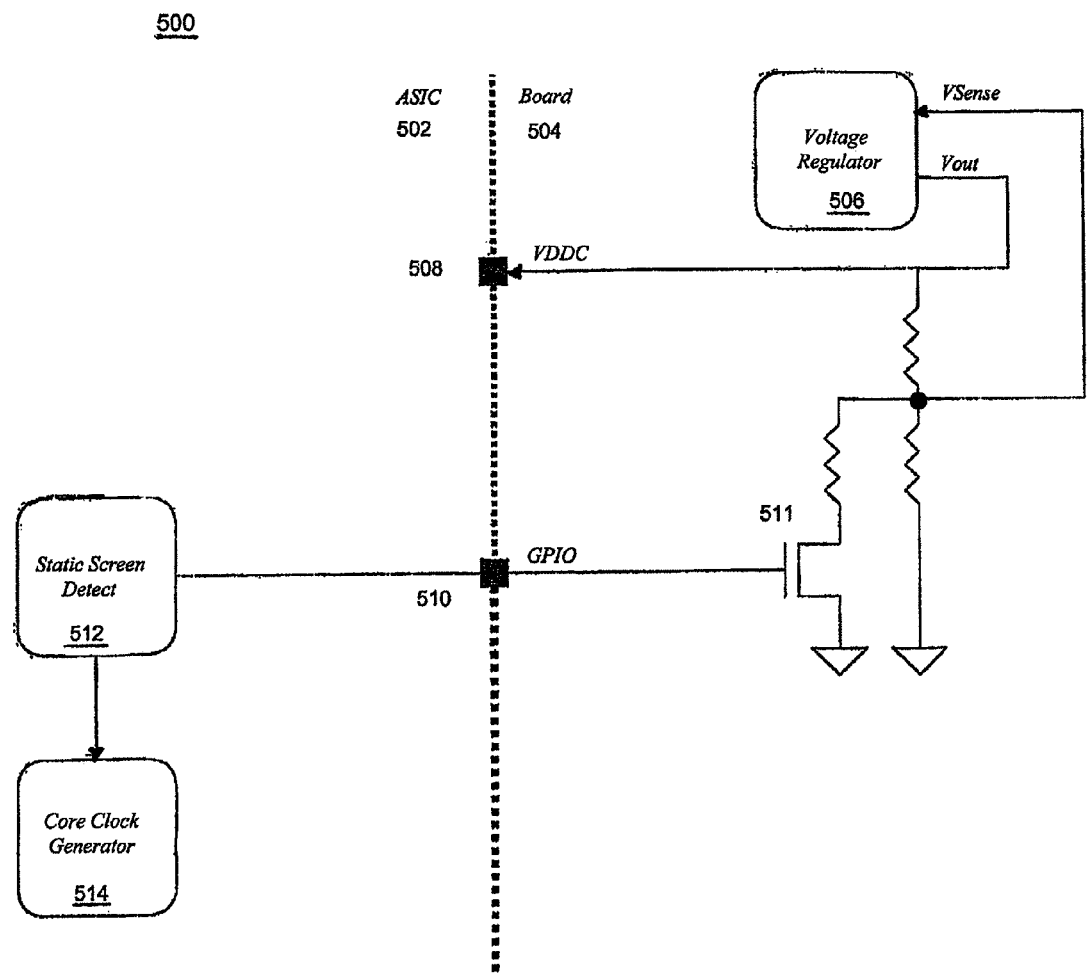
FIG. 5 is a circuit diagram that illustrates a voltage control circuit for controlling the drain voltage to a graphics processor based on the status of a screen display, under an embodiment.

FIG. 5 is a circuit diagram that illustrates a voltage control circuit for controlling the drain voltage to a graphics processor based on the status of a screen display, under an embodiment. The circuit 500 of FIG. 5 can be used to implement one or more aspects of the process illustrated in FIG. 4. As shown in system 500, ASIC 502 is mounted on board 504, and contains a static screen detection component 512, which is coupled to a core clock generator 514. The core clock generator controls the frequency of the ASIC clock signals and allows the reduction or increase in the clock frequencies illustrated in blocks 404 and 412 of FIG. 4. The static screen detect circuit 512 provides a signal to switch circuit 511 on board 504 through GPIO port 510. The detection signal is passed to the $V_{sense}$ input of voltage regulator 506. In response to this signal, the voltage regulator provides the appropriate VDD voltage level back to the ASIC 502 through GPIO port 508. The drain voltage level is thus controlled by the condition detected by the static screen detect component 512, and the voltage regulator triggers the GPIO interface 508 to raise or lower this voltage, as shown in blocks 406 and 410 of FIG. 4. The minimum value of $V_{DD}$ is selected such that the transistors can operate in standby mode, yet is low enough to provide a substantial enough reduction in leakage current during this standby mode.

FIG. 4 illustrates a method in which the level of the drain voltage $V_{DD}$, is used to reduce the leakage current during standby or sleep mode of the ASIC. Alternatively, block 406 can be replaced by a step that incorporates the application of the back bias voltage levels from the BBP and BBN voltage rails to the body terminals of the transistors to reduce the leakage current by effectively decreasing the threshold voltages of the transistors.

Figure 6:
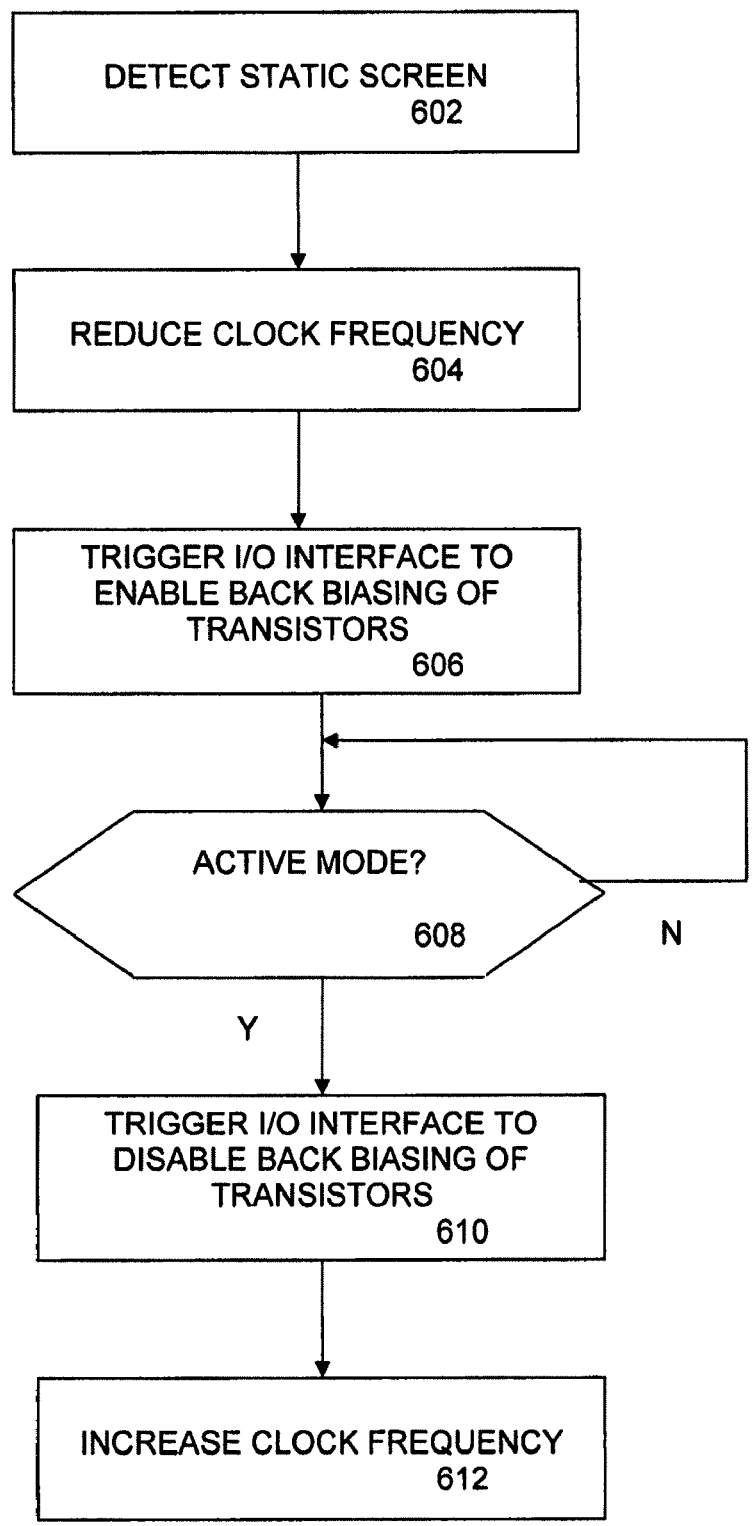
FIG. 6 is a flowchart that illustrates a method of triggering back biasing based on the status of a screen display, under an embodiment.

FIG. 6 is a flowchart that illustrates a method of triggering back biasing based on the status of a screen display, under an embodiment. In block 602, the process detects whether a static screen condition is detected. As stated above with respect to FIG. 4, various indicators can be used to detect this condition, such as if the same screen display elements as a whole or for a significant portion of the entire screen display are static for a specified number of frames. Upon detection of a static screen condition, the process reduces the current clock operating frequency by a pre-determined factor, such as by one-half or one-quarter of the frequency, block 604. In block 606, the process triggers the GPIO interface (or other I/O interface) to enable back biasing of the transistors. In one embodiment, this is accomplished by applying to the body terminals of the transistors either or both of a positive or negative back bias voltage that are provided by back bias voltage rails, e.g., BBP and BBN. The application of back bias voltages effectively reduces the threshold voltage of the transistors, thus eliminating or reducing the leakage current through the transistors.

In one embodiment, the transistors are kept in back bias mode until a change in from standby mode to active mode of the ASIC is detected. Thus, as shown in block 608, the process determines whether the chip has entered active mode. If so, the transistors are taken out of the back bias condition so that they can operate at their maximum possible clock speeds. As shown in block 610, the GPIO interface is triggered to disable the back bias condition of the transistors so as to restore the threshold voltage to its normal level. The clock frequency is then increased to its normal or maximum operating frequency, block 612, to enable the ASIC to function optimally in active mode.

Figure 7:
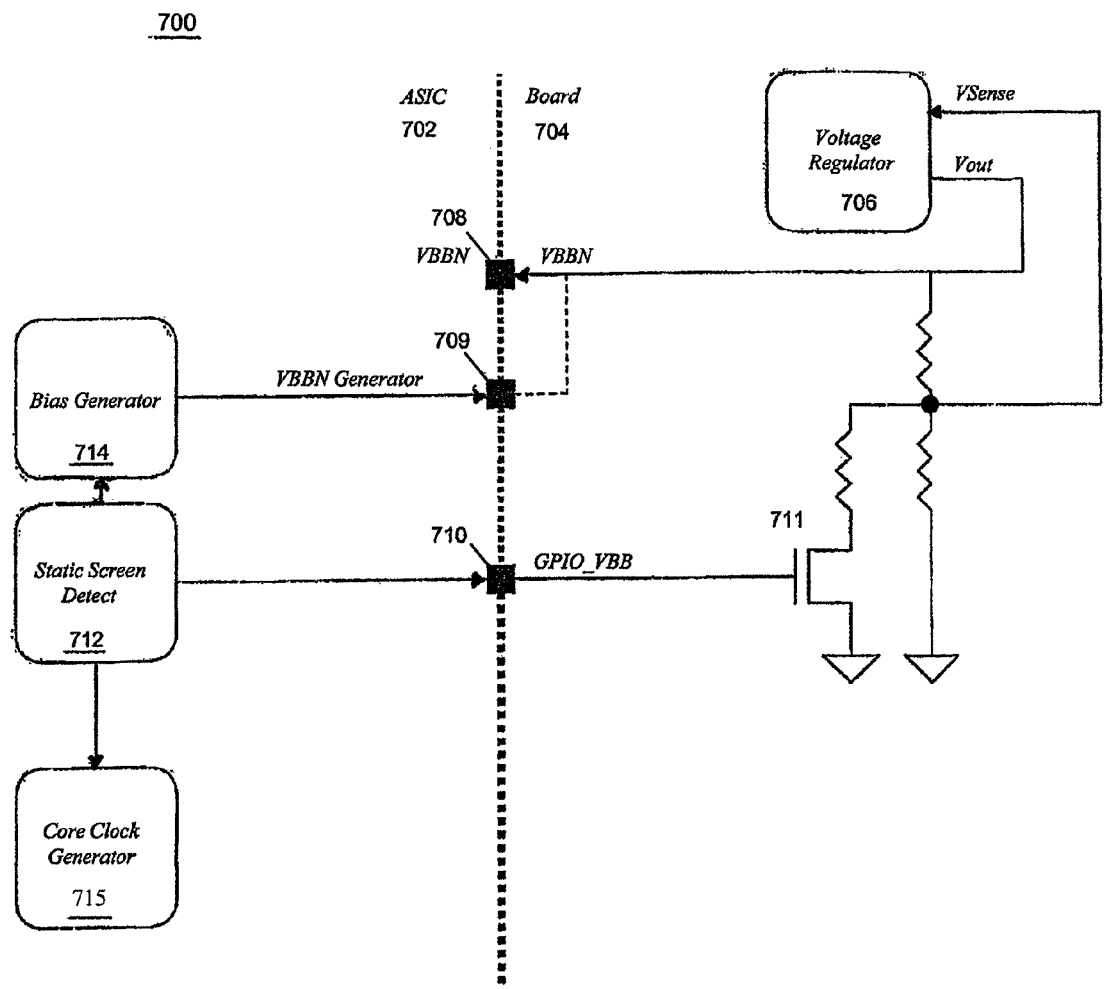
FIG. 7 is a circuit diagram that illustrates a voltage control circuit for controlling the application of back bias voltage to a graphics processor based on the status of a screen display, under an embodiment.

FIG. 7 is a circuit diagram that illustrates a voltage control circuit for controlling the application of back bias voltage to a graphics processor based on the status of a screen display, under an embodiment. The circuit 700 of FIG. 7 can be used to implement one or more aspects of the process illustrated in FIG. 6. As shown in system 700, ASIC 702 is mounted on board 704, and contains a static screen detection component 712, which is couple to a core clock generator 715. The core clock generator controls the frequency of the ASIC clock signals and allows the reduction or increase in the clock frequencies illustrated in blocks 604 and 612 of FIG. 6. The static screen detect circuit 712 provides a signal to switch circuit 711 on board 704 through GPIO port 710. The detection signal is passed to the $V_{sense}$ input of voltage regulator 706. In response to this signal, the voltage regulator 706 provides the appropriate back bias voltage $V_{BN}$ level back to the ASIC 702 through GPIO port 708. The static screen detect component 712 also provides a signal to a bias generator component 714. This component 714 provides a back bias generator signal through GPIO port 709 to port 708 for enabling or disabling the back bias voltage $V_{BN}$ provided to port 708 from voltage regulator 706. The back bias voltage is thus generated by the voltage regulator and controlled by the condition detected by the static screen detect component 712 as passed through bias generator 714.

FIG. 7 shows an embodiment in which the back bias voltage comprises a negative voltage provided by the BBN power rail. Alternatively, a positive back bias voltage $V_{BP}$ could also be provided through the BBP power rail. For this embodiment, separate bias generator and voltage regulator components could be provided to generate and control the application of $V_{BP}$ to the ASIC, or bias generator 714 and voltage regulator 706 could be configured to handle both $V_{BP}$ and $V_{BN}$.

In one embodiment, the back bias voltage $V_{BP}$ and/or $V_{BN}$ are fixed at a certain maximum value and enabled or disabled through a binary signal generated by bias generator 714. This results in the effective shift of the threshold voltage 120 from a first value to a second value. In an alternative embodiment, the voltage regulator can be configured to provide a range of voltages for $V_{BP}$ and/or $V_{BN}$, along a number of discrete intermediate voltage values, or a continuum between the maximum and minimum ranges for the positive and negative back bias values. This allows the threshold voltage 120 to be shifted to a number of intermediate voltages between the first and second values, and thus allows the leakage current to be reduced to a certain level. The voltage regulator can be programmed to provide the appropriate back bias voltage levels based on one or more parameters based on the operating conditions and requirements of the ASIC.

Although embodiments have been described in relation to specific types of circuits, such as graphic processing units, it should be noted that the described methods and systems can be used in any type of transistor-based logic circuit, such as microprocessors, co-processors, arithmetic logic units, and the like. Aspects of the dynamic leakage control system described herein may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: microcontrollers with memory (such as EEPROM), embedded microprocessors, firmware, software, etc. Furthermore, aspects of the dynamic leakage control system may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, and so on).

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the dynamic leakage control system is not intended to be exhaustive or to limit the embodiments to the precise form or instructions disclosed. While specific embodiments of, and examples for, processes in graphic processing units or ASICs are described herein for illustrative purposes, various equivalent modifications are possible within the scope of the disclosed methods and structures, as those skilled in the relevant art will recognize.

The elements and acts of the various embodiments described above can be combined to provide further embodiments. These and other changes can be made to the dynamic leakage control system in light of the above detailed description.

In general, in the following claims, the terms used should not be construed to limit the disclosed method to the specific embodiments disclosed in the specification and the claims, but should be construed to include all operations or processes that operate under the claims. Accordingly, the disclosed structures and methods are not limited by the disclosure, but instead the scope of the recited method is to be determined entirely by the claims.

While certain aspects of the disclosed embodiments are presented below in certain claim forms, the inventors contemplate the various aspects of the methodology in any number of claim forms. For example, while only one aspect may be recited as embodied in machine-readable medium, other aspects may likewise be embodied in machine-readable medium. Accordingly, the inventors reserve the right to add additional claims after filing the application to pursue such additional claim forms for other aspects.

What is claimed is:

1. A method of controlling leakage current in a circuit, comprising:
   responsive to a change in a device from a first state to a second state, reducing an operating frequency provided by a system clock to the circuit from a first frequency to a second frequency; and
   providing a back bias voltage to the circuit to effectively reduce a threshold voltage of the circuit along a voltage range between a first threshold voltage value to a second voltage value in response to the change in the device;
   wherein the first state comprises an active state of the circuit and the second state comprises a standby state of the circuit;
   wherein the standby state is detected by the presence of one or more indicators; and
   wherein one of the one or more indicators comprises detecting a static screen display.

2. The method of claim 1, further comprising detecting the persistence of an image displayed on a displayed device coupled to the circuit for a specified number of clock cycles of the system clock.

3. The method of claim 1, wherein the one or more indicators are selected from the group consisting essentially of: one or more returned busy signals, sleep mode flag activation, reduction in power draw, and reduced buffer activity.

4. The method of claim 1, wherein the method comprises providing a back bias voltage to the circuit to effectively reduce a threshold voltage of the circuit along a voltage range between a first threshold voltage value to a second voltage value in response to the change in the device, and wherein the back bias voltage comprises a negative voltage applied to a body terminal of at least one transistor of the circuit.

5. The method of claim 1,
   wherein the method comprises providing a back bias voltage to the circuit to effectively reduce a threshold voltage of the circuit along a voltage range between a first threshold voltage value to a second voltage value in response to the change in the device, and wherein the back bias voltage comprises a voltage applied to a body terminal of at least one transistor of the circuit; and wherein the back bias voltage either:

is provided to the at least one transistor through a first voltage regulator circuit coupled to a negative back bias voltage supply rail, the first voltage regulator controlled by a state machine circuit in response to the detected change of state; or further comprises a positive voltage applied to the body terminal of the at least one transistor of the circuit.

6. The method of claim 1, wherein the method comprises providing a back bias voltage to the circuit to effectively reduce a threshold voltage of the circuit along a voltage range between a first threshold voltage value to a second voltage value in response to the change in the device, and wherein the back bias voltage comprises a voltage applied to a body terminal of at least one transistor of the circuit; and wherein the back bias voltage is provided to the at least one transistor through a first voltage regulator circuit coupled to a negative back bias voltage supply rail and a second voltage regulator circuit coupled to a positive back bias voltage supply rail, the first voltage regulator and the second voltage regulator being controlled by a state machine circuit in response to the detected change of state.

7. The method of claim 6, wherein the second voltage regulator circuit is configured to switch the back bias voltage range from a third value to a fourth value.

8. A circuit comprising:

a condition detector, detecting a change of state of the circuit from a first state to a second state;

a state machine coupled to the condition detector, generating a control signal in response to the change of state;

a core clock generator coupled to the state machine, reducing an operating frequency from a first frequency to a second frequency; and a voltage regulator coupled to the state machine, providing a back bias voltage to the circuit to effectively reduce a threshold voltage of the circuit along a voltage range between a first threshold voltage value to a second voltage value in response to the control signal.

9. The circuit of claim 8, wherein the first state comprises an active state of the circuit and the second state comprises a standby state of the circuit, and the standby state is detected by the presence of one or more indicators.

10. The circuit of claim 9, wherein the circuit comprises at least one transistor, and further wherein the back bias voltage is selected from the group consisting of a negative voltage applied to a body terminal of the at least one transistor of the circuit, and a positive voltage applied to the body terminal of at least one transistor of the circuit.

11. The circuit of claim 10, wherein the circuit comprises a circuit within an application specific integrated circuit device mounted on a printed-circuit board.

12. The circuit of claim 11, wherein the circuit comprises at least a portion of a graphics processing unit.

* * * * *